United States Patent
Reykowski et al.

(10) Patent No.: US 10,215,818 B2
(45) Date of Patent: Feb. 26, 2019

(54) SINGLE COAXIAL INTERFACE FOR MAGNETIC RESONACE (MR) COILS

(71) Applicant: KONINKLIJKE PHILIPS N.V., Eindhoven (NL)

(72) Inventors: Arne Reykowski, Eindhoven (NL); Rodney Housen, Eindhoven (NL); Henricus Gerardus Roeven, Eindhoven (NL); Lambertus deVries, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 513 days.

(21) Appl. No.: 14/785,959

(22) PCT Filed: Apr. 8, 2014

(86) PCT No.: PCT/IB2014/060524
§ 371 (c)(1),
(2) Date: Oct. 21, 2015

(87) PCT Pub. No.: WO2014/174396
PCT Pub. Date: Oct. 30, 2014

(65) Prior Publication Data
US 2016/0097829 A1    Apr. 7, 2016

Related U.S. Application Data

(60) Provisional application No. 61/815,026, filed on Apr. 23, 2013.

(51) Int. Cl.
*G01R 33/36* (2006.01)
*G01R 33/58* (2006.01)
*G01R 33/3415* (2006.01)

(52) U.S. Cl.
CPC ...... *G01R 33/3628* (2013.01); *G01R 33/3621* (2013.01); *G01R 33/3657* (2013.01); *G01R 33/58* (2013.01); *G01R 33/3415* (2013.01)

(58) Field of Classification Search
CPC ............ G01R 33/3628; G01R 33/3621; G01R 33/3657; G01R 33/58; G01R 33/3415
(Continued)

(56) References Cited

U.S. PATENT DOCUMENTS 4,620,155 A * 10/1986 Edelstein ............. G08B 13/196
324/318
4,763,076 A * 8/1988 Arakawa ............ G01R 33/3628
324/318
(Continued)

FOREIGN PATENT DOCUMENTS

WO    2013027027 A2    2/2013

OTHER PUBLICATIONS

K. Parker "3. Ensemble Averaging" Dec. 31, 2012 Imperial College London.

*Primary Examiner* — Jermele M Hollington
*Assistant Examiner* — Sean Curtis

(57) ABSTRACT

A magnetic resonance (MR) coil array (26, 28) connected by way of a single transmission line (46, 48) is provided. The MR coil array (26, 28) includes a coil element (34) and a corresponding coil element circuit (32). The coil element circuit (32) includes at least one active component (40) powered by a power signal carried on the coaxial transmission line (46, 48). The voltage of the power signal varies between first and second direct current (DC) voltages of the same polarity. The coil element circuit (32) further includes a tune/detune circuit (42) connected to the coaxial transmission line (46, 48). The tune/detune circuit (42) tunes or detunes the coil element (34) based on the first and second DC voltages. An MR system (10) using the MR coil array
(Continued)

(26, 28) and a method (10) for tuning or detuning the MR coil (26, 28) are also provided. Accordingly, a single coaxial cable between the MR system and the coil element is sufficient for conveying MR data, a power signal for the preamplifier and a detuning signal. Moreover, the preamplifier can be powered irrespective of the coil element being in the tuned or in the detuned state.

15 Claims, 4 Drawing Sheets

(58) Field of Classification Search
USPC .................................................. 324/300–322
See application file for complete search history.

(56) References Cited

U.S. PATENT DOCUMENTS

| | | | | | |
|---|---|---|---|---|---|
| 4,782,298 | A * | 11/1988 | Arakawa | G01R 33/3628 | 324/318 |
| 4,855,680 | A * | 8/1989 | Arakawa | G01R 33/3628 | 324/314 |
| 5,075,624 | A * | 12/1991 | Bezjak | G01R 33/34046 | 324/318 |
| 5,136,244 | A * | 8/1992 | Jones | G01R 33/34061 | 324/318 |
| 5,432,451 | A * | 7/1995 | McGill | G01R 33/3628 | 324/318 |
| 5,898,306 | A * | 4/1999 | Liu | G01R 33/3678 | 324/318 |
| 6,054,858 | A * | 4/2000 | Dumoulin | G01R 33/3628 | 324/314 |
| 6,160,400 | A * | 12/2000 | Friedrich | G01R 33/3628 | 324/318 |
| 6,414,488 | B1 * | 7/2002 | Chmielewski | G01R 33/3657 | 324/311 |
| 6,633,161 | B1 * | 10/2003 | Vaughan, Jr. | G01R 33/34046 | 324/318 |
| 6,639,406 | B1 * | 10/2003 | Boskamp | G01R 33/3415 | 324/318 |
| 6,710,597 | B2 * | 3/2004 | Reykowski | G01R 33/3657 | 324/318 |
| 6,850,067 | B1 * | 2/2005 | Burl | G01R 33/3657 | 324/318 |
| 6,975,114 | B1 * | 12/2005 | Ledden | G01R 33/288 | 324/312 |
| 7,030,614 | B2 * | 4/2006 | Matschl | G01R 33/3664 | 324/318 |
| 7,088,100 | B2 * | 8/2006 | Boskamp | G01R 33/34046 | 324/309 |
| 7,088,104 | B2 * | 8/2006 | Bottomley | G01R 33/34046 | 324/322 |
| 7,236,816 | B2 * | 6/2007 | Kumar | A61B 5/055 | 600/411 |
| 7,268,554 | B2 * | 9/2007 | Vaughan | G01R 33/34046 | 324/318 |
| 7,671,595 | B2 * | 3/2010 | Griswold | G01R 33/3415 | 324/318 |
| 7,778,682 | B2 * | 8/2010 | Kumar | A61B 5/055 | 600/411 |
| 7,932,721 | B2 * | 4/2011 | Nascimento | G01R 33/365 | 324/309 |
| 8,138,762 | B2 * | 3/2012 | Zhu | G01R 33/365 | 324/318 |
| 8,169,221 | B2 * | 5/2012 | Griswold | G01R 33/3635 | 324/307 |
| 8,228,065 | B2 * | 7/2012 | Wirtz | G01R 33/287 | 324/307 |
| 9,063,199 | B2 * | 6/2015 | Greim | G01R 33/3621 | |
| 9,500,727 | B2 * | 11/2016 | Sohn | G01R 33/34092 | |
| 9,625,551 | B2 * | 4/2017 | Ozen | G01R 33/543 | |
| 9,720,060 | B2 * | 8/2017 | Reykowski | G01R 33/3628 | |
| 9,983,280 | B2 * | 5/2018 | Tan | G01R 33/3657 | |
| 2002/0180437 | A1 * | 12/2002 | Reykowski | G01R 33/3657 | 324/309 |
| 2003/0173966 | A1 * | 9/2003 | Scott | G01R 33/285 | 324/322 |
| 2005/0156598 | A1 * | 7/2005 | Matschl | G01R 33/3664 | 324/322 |
| 2005/0197579 | A1 * | 9/2005 | Baker, Jr. | A61B 5/14551 | 600/473 |
| 2006/0173284 | A1 * | 8/2006 | Ackerman | G01R 33/287 | 600/422 |
| 2006/0217615 | A1 * | 9/2006 | Huiku | A61B 5/08 | 600/484 |
| 2007/0088416 | A1 * | 4/2007 | Atalar | A61N 1/05 | 607/115 |
| 2007/0106148 | A1 * | 5/2007 | Dumoulin | A61B 5/055 | 600/410 |
| 2007/0293753 | A1 * | 12/2007 | El-Sharkawy | G01K 11/006 | 600/412 |
| 2008/0119919 | A1 * | 5/2008 | Atalar | A61N 1/05 | 607/116 |
| 2008/0136415 | A1 * | 6/2008 | de Rooij | G01R 33/3621 | 324/322 |
| 2008/0231282 | A1 * | 9/2008 | Griswold | G01R 33/3415 | 324/322 |
| 2009/0033325 | A1 * | 2/2009 | Miura | G01R 33/4641 | 324/307 |
| 2009/0134876 | A1 * | 5/2009 | Griswold | G01R 33/3415 | 324/318 |
| 2009/0278537 | A1 * | 11/2009 | Harvey | G01R 33/288 | 324/309 |
| 2010/0013484 | A1 * | 1/2010 | Wirtz | G01R 33/287 | 324/318 |
| 2011/0309832 | A1 * | 12/2011 | Alagappan | A61B 5/055 | 324/318 |
| 2012/0062230 | A1 * | 3/2012 | Vaughan, Jr. | G01R 33/3415 | 324/318 |
| 2012/0223709 | A1 * | 9/2012 | Schillak | G01R 33/3607 | 324/309 |
| 2012/0223714 | A1 * | 9/2012 | Greim | G01R 33/3621 | 324/318 |
| 2013/0009644 | A1 * | 1/2013 | Kawai | G01R 33/365 | 324/322 |
| 2014/0070808 | A1 * | 3/2014 | Reykowski | G01R 33/3628 | 324/309 |
| 2014/0210475 | A1 * | 7/2014 | Li | G01R 33/3628 | 324/322 |
| 2014/0312902 | A1 * | 10/2014 | Tan | G01R 33/3657 | 324/322 |
| 2015/0022208 | A1 * | 1/2015 | Biber | G01R 33/3664 | 324/309 |
| 2015/0331074 | A1 * | 11/2015 | Biber | G01R 33/36 | 324/322 |
| 2015/0362569 | A1 * | 12/2015 | Kaggie | A61B 5/055 | 324/322 |
| 2016/0097829 | A1 * | 4/2016 | Reykowski | G01R 33/3621 | 324/322 |
| 2017/0176551 | A1 * | 6/2017 | Deunsing | G01R 33/3657 | |
| 2017/0205481 | A1 * | 7/2017 | Kim | G01R 33/3628 | |

* cited by examiner

SINGLE COAXIAL INTERFACE FOR MAGNETIC RESONACE (MR) COILS

CROSS REFERENCE TO RELATED APPLICATIONS

This application is a U.S. national phase application of International Application No. PCT/IB2014/060524, filed on Apr. 8, 2014, which claims the benefit of U.S. provisional Application Ser. No. 61/815,026 filed on Apr. 23, 2013 and is incorporated herein by reference.

The present application relates generally to magnetic resonance (MR) imaging. It finds particular application in conjunction with MR coil arrays, and will be described with particular reference thereto. However, it is to be understood that it also finds application in other usage scenarios and is not necessarily limited to the aforementioned application.

Inside an MR coil array, the internal wiring connects between various coil channels and an external system connector. Each of the coil channels includes a coil element board (CEB) and a corresponding coil element. Each of the CEBs requires connectivity for three types of signals: power; a tune/detune control signal; and a radiofrequency (RF) signal output. As to power, each CEB contains one or more active components, including at least a preamplifier, that require a supply of power. This power is usually provided as a direct current (DC) voltage source with certain maximum current. As to the tune/detune control signal, all coil elements have to be detuned during the transmit (TX) phase of an MR imaging sequence. In addition, it is often desirable to completely detune unused coil elements during both the TX and receive (RX) phases. Hence, each CEB is supplied with a tune/detune control signal. As to RF signal out, the amplified MM RF signal of each active coil channel has to be transported from the CEB to the system connector.

In state-of-the-art MR coil arrays, power and the RF signal output are combined onto a single transmission line. The tune/detune control signal is supplied with a separate transmission line that often shares the return path ground with the other two signals. For safety reasons, any transmission line inside the MR system has to be designed in such a way that during the TX phase, RF currents on the cable are reduced to safe levels. For this purpose, all lines typically need to have either Baluns or RF traps that provide high impedance to any induced RF currents. However, these Balun and RF trap circuits, along with cable connectors, add a burden of cost and complexity to the MR coil array. In addition to that, coupling between adjacent transmission lines can lead to unwanted effects, such as crosstalk, as well as additional transmission line modes that may have detrimental effects on image quality and overall system stability (due to increased feedback).

The present application provides a new and improved system and method which overcome the above-referenced problems and others.

In accordance with one aspect, a magnetic resonance (MR) coil array is provided. The MR coil array includes one or more coil channels, each corresponding to a coil element, and is connected to an external system or device using a coaxial transmission line. The MR coil array includes a coil element and a corresponding coil element circuit. The coil element corresponds to one of the coil channels. The coil element circuit includes at least one active component powered by a power signal carried on the coaxial transmission line. The voltage of the power signal varying between first and second direct current (DC) voltages of the same polarity. The coil element circuit includes a tune/detune circuit connected to the coaxial transmission line. The tune/detune circuit tunes or detunes the coil element based on the first and second DC voltages of the power signal.

In accordance with another aspect, a method for tuning or detuning an MR coil array is provided. The MR coil array includes one or more coil channels, each corresponding to a coil element, and is connected to an external system or device using a coaxial transmission line. The method includes powering at least one active component of the MR coil array by a power signal carried on the coaxial transmission line. The voltage of the power signal varies between first and second direct current (DC) voltages of the same polarity. The method further includes tuning or detuning a coil element of the MR coil array corresponding to one of the coil channels by a tune/detune circuit of the MR coil array. The tune/detune circuit tunes or detunes the coil element based on the first and second DC voltages of the power signal and is connected to the coaxial transmission line.

In accordance with another aspect, a magnetic resonance (MR) system including an MR coil array is provided. The MR coil array includes one or more coil channels, each corresponding to a coil element, and is connected to an external system or device using a coaxial transmission line. The MR system includes a tune/detune circuit of the MR coil array tuning or detuning a coil element of the MR coil array based on a power signal carried on the coaxial transmission line. The voltage of the power signal varies between first and second direct current (DC) voltages of the same polarity to indicate a tune or detune state. The MR system further includes a driver circuit connecting the MR coil array to an external MR receiver. The driver circuit adds the power signal to the coaxial transmission line by selecting between two power sources based on a tune/detune command. Each power source provides a different direct current (DC) voltage of the same polarity as the other.

One advantage resides in reduced cost.

Another advantage resides in improved system stability.

Another advantage resides in reduction of the total number of internal cables.

Another advantage resides in reduced complexity.

Another advantage resides in reduced coupling between adjacent transmission lines.

Another advantage resides in reduced cross talk.

Another advantage resides in reduced transmission line modes.

Another advantage resides in improved image quality.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

The present invention proposes an approach to combine the three signals of a magnetic resonance (MR) coil element board (CEB) (i.e., power, a tune/detune control signal, and a radiofrequency (RF) signal output) onto a single transmission line. This approach simplifies cabling, and reduces the number of connectors and traps required for the coil internal signal connections. In addition, by having fewer cables and/or transmission lines, unwanted crosstalk and transmission line modes will be reduced, increasing overall system stability.

Figure 1:
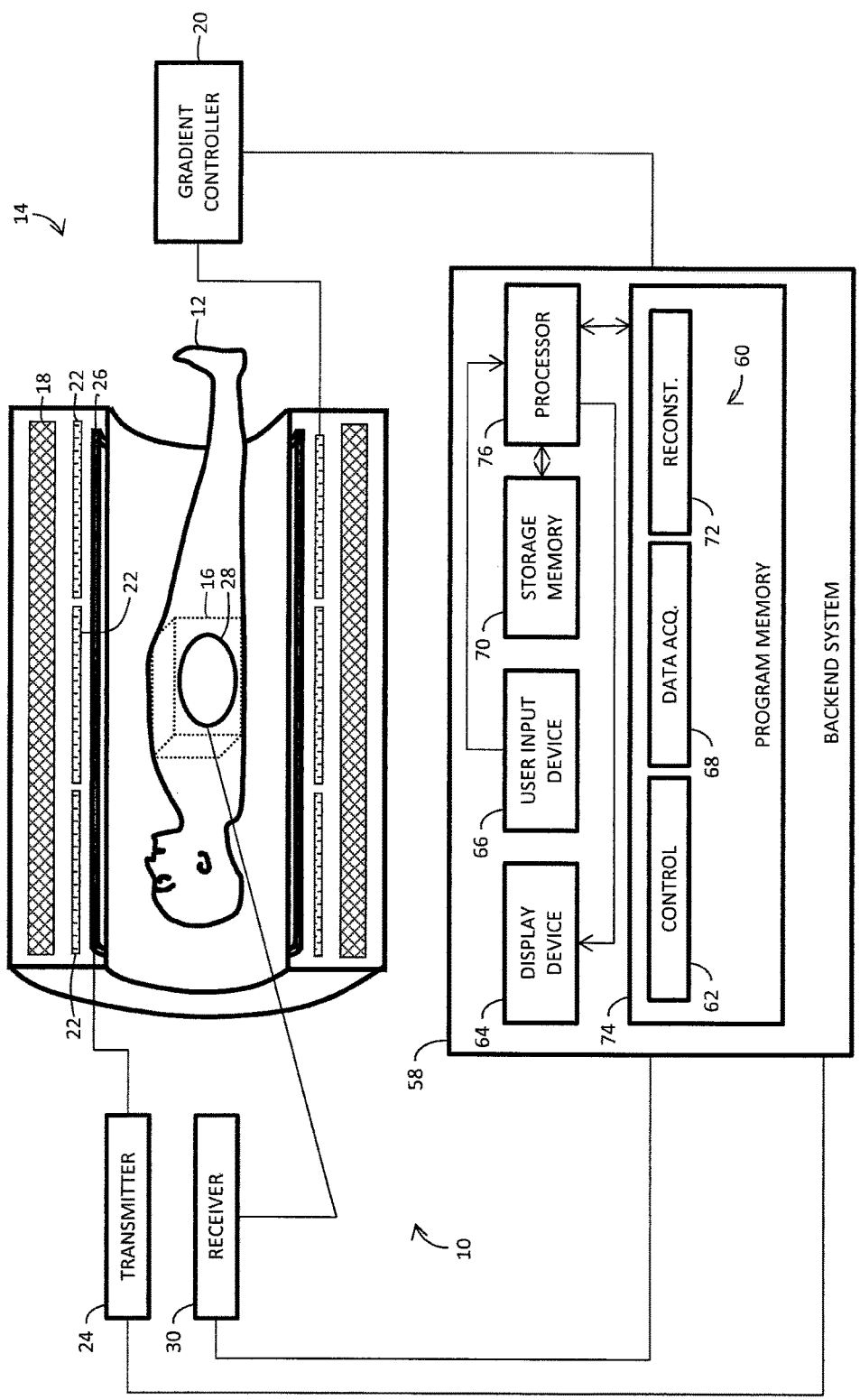
FIG. 1 illustrates a magnetic resonance (MR) system with enhanced MR coil array connectivity.

With reference to FIG. 1, a magnetic resonance imaging (MR) system 10 utilizes MR to image a region of interest (ROI) of a patient 12. The system 10 includes a scanner 14 defining an imaging volume 16 (indicated in phantom) sized to accommodate the ROI. A patient support can be employed to support the patient 12 in the scanner 14 and facilitates positioning the ROI in the imaging volume 16.

The scanner 14 includes a main magnet 18 that creates a strong, static $B_0$ magnetic field extending through the imaging volume 16. The main magnet 18 typically employs superconducting coils to create the static $B_0$ magnetic field. However, the main magnet 18 can also employ permanent or resistive magnets. Insofar as superconducting coils are employed, the main magnet 18 includes a cooling system, such as a liquid helium cooled cryostat, for the superconducting coils. The strength of the static $B_0$ magnetic field is commonly one of 0.23 Tesla, 0.5 Tesla, 1.5 Tesla, 3 Tesla, 7 Tesla, and so on in the imaging volume 16, but other strengths are contemplated.

A gradient controller 20 of the scanner 14 is controlled to superimpose magnetic field gradients, such as x, y and z gradients, on the static $B_0$ magnetic field in the imaging volume 16 using a plurality of magnetic field gradient coils 22 of the scanner 14. The magnetic field gradients spatially encode magnetic spins within the imaging volume 16. Typically, the plurality of magnetic field gradient coils 22 include three separate magnetic field gradient coils spatially encoding in three orthogonal spatial directions.

Further, one or more transmitters 24, such as a transceiver, are controlled to transmit $B_1$ resonance excitation and manipulation radiofrequency (RF) pulses into the imaging volume 16 with one or more transmit coil arrays, such as a whole body coil 26 and/or a surface coil 28, of the scanner 14. The $B_1$ pulses are typically of short duration and, when taken together with the magnetic field gradients, achieve a selected manipulation of magnetic resonance. For example, the $B_1$ pulses excite the hydrogen dipoles to resonance and the magnetic field gradients encode spatial information in the frequency and phase of the resonance signal. By adjusting the RF frequencies, resonance can be excited in other dipoles, such as phosphorous, which tend to concentrate in known tissues, such as bones. The transmitters 24 can be external or internal to the scanner 14. Further, the transmitters 24 can be integrated with the transmit coil arrays 26, 28.

One or more receivers 30, such as a transceiver, are controlled to receive spatially encoded magnetic resonance signals from the imaging volume 16 and demodulate the received spatially encoded magnetic resonance signals to MR data sets. The MR data sets include, for example, k-space data trajectories. To receive the spatially encoded magnetic resonance signals, the receivers 30 use one or more receive coil arrays, such as the whole body coil 26 and/or the surface coil 28, of the scanner 14. The receivers 30 typically store the MR data sets in a buffer memory. The receivers 30 can be external or internal to the scanner 14. Further, the receivers 30 can be integrated with the receive coil arrays 26, 28.

Each of the receive coil arrays 26, 28 includes one or more coil channels, typically ranging from 8-32 channels. Each of the coil channels includes a CEB 32 (see FIG. 3) and a corresponding coil element 34 (see FIG. 3). The coil element 34 can, for example, be a winding of electrical wire, and the CEB 32 can, for example, be a circuit board including the requisite circuitry to facilitate tuning/detuning of the coil element 34 and delivery of the spatially encoded magnetic resonance signals to the receivers 30. The CEB 32 requires connectivity to the receivers 30 for three types of signals: power; a tune/detune control signal; and a radiofrequency (RF) signal output. These three signals are advantageously combined onto a single transmission line spanning between the CEB 32 and the receivers 30. The CEB 32 and the coil element 34 are both disposed in the corresponding receive coil array.

Figure 2:
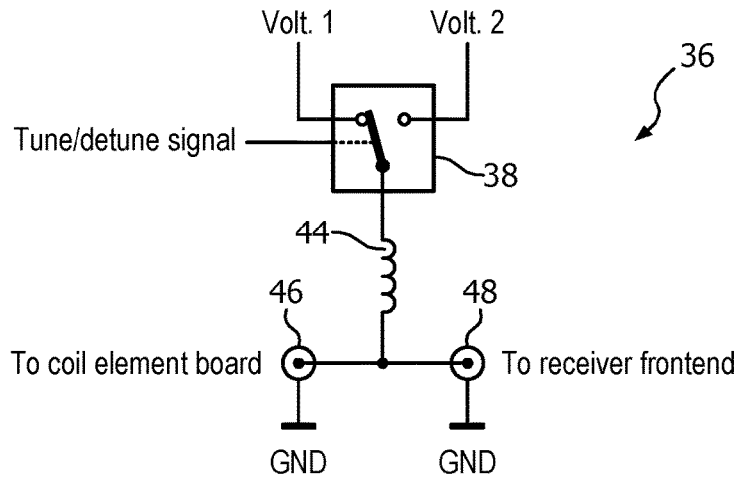
FIG. 2 illustrates a driver circuit facilitating MR coil array connectivity.

With reference to FIG. 2, a driver circuit 36 for combining the three signals onto a single transmission line is provided. The circuit 36 is typically disposed intermediate the corresponding receiver and the CEB 32. The circuit 36 can be disposed in the corresponding receiver, in the corresponding receive coil array, in both the corresponding receiver and receive coil array, or external to both the corresponding receiver and the corresponding receive coil array. For example, the circuit 36, the corresponding receiver, and the corresponding receive coil array can be integrated into a single unit located in the scanner 14.

The circuit 36 receives a tune/detune control signal. The tune/detune control signal indicates whether to tune the corresponding coil channel or detune the corresponding coil channel. The tune/detune control signal is typically is a direct current (DC) signal changing between two voltages to indicate tune and detune, respectively. For example, +10 volts (V) on the tune/detune control signal can indicate tune and −5V on the tune/detune signal can indicate detune. Suitably, the tune/detune control signal controls a switch 38 between two DC power signals, typically of the same polarity, to power the CEB 32. The two power signals are typically provided by low-dropout regulators. The CEB 32 includes at least a preamplifier 40 (e.g., a low noise amplifier (LNA)) (see FIG. 3) and a tune/detune circuit 42 (see FIG. 3). The two power signals are typically +5V and +3.3V. The +5V value indicates a "tune" state of the corresponding receive coil array and is used to reverse bias the switching diodes in the detune circuits. The +3.3V value indicates a "detune" state and is used to forward bias the switching diodes in the detune circuits.

A high impedance device 44, such as an inductor or a Balun or RF trap, is placed in series with the switch 38 following the output of the switch 38. The high impedance device 44 limits potential currents the upstream components (e.g., the switch 38) can experience to safe levels. Further, the CEB 32 and the corresponding receiver are connected, typically using coaxial transmission lines 46, 48, and provided power by way of the high impedance device 44.

Figure 3:
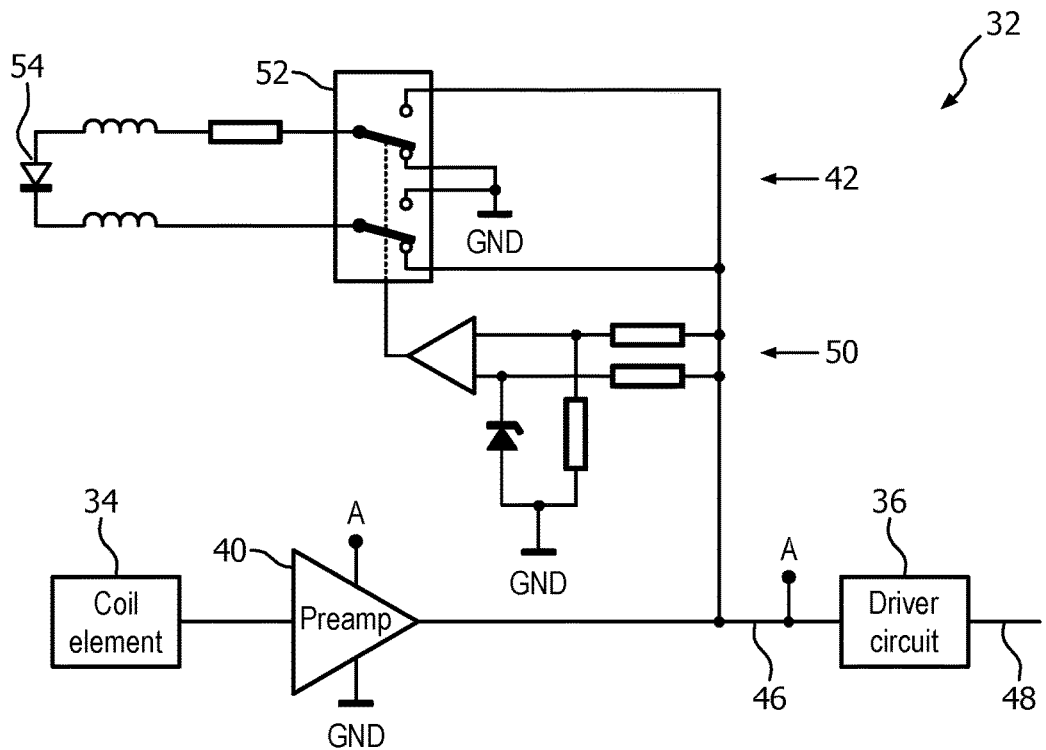
FIG. 3 illustrates a partial view of a coil element board (CEB), which includes a tune/detune circuit facilitating MR coil array connectivity.
Figure 4:
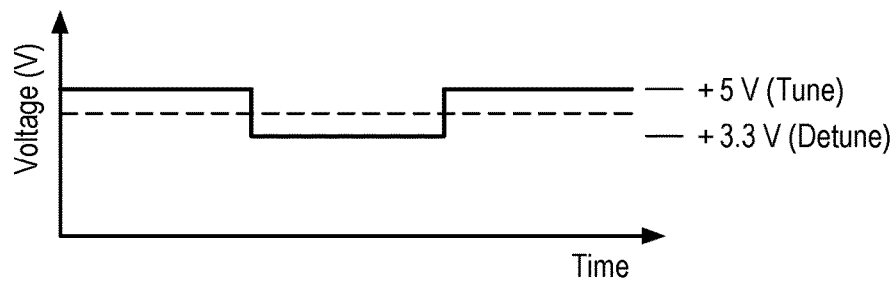
FIG. 4 illustrates a graph of the signal provided to the tune/detune circuit of FIG. 3.

With reference to FIG. 3, a partial view of the CEB 32 is illustrated. The CEB 32 receives one of the two power signals from the driver circuit 36 depending upon the tune/detune control signal. FIG. 4 illustrates an example of the received signal and the transition between states. The power signals are used to drive the preamplifier 40 of the CEB 32. The preamplifier 40 is gain stable over the range of the voltages corresponding to the "tune" and "detune" states (e.g., 3.3V and 5V) and has a sufficiently short settling time when switching between the "tune" and "detune" states (typically less than 50 microseconds). As should be appreciated, the preamplifier 40 is always provided power, whether the CEB 32 is in the "tune" or "detune" state or switching from one state to another, which allows faster settling than powering the preamplifier 40 completely on and off. The preamplifier 40 is connected in series with the coil element 34 and the driver circuit 36, where the input of the preamplifier 40 connected to the coil element 34 and the output of the preamplifier 40 connected to the driver circuit 36.

A comparator circuit 50 of the tune/detune circuit 42 monitors the voltage of signal received from the driver circuit 36 to determine which of the two power signals is received. In that regard, the comparator circuit 50 compares the received voltage to a reference voltage intermediate the voltages of the two power signals. For example, the comparator circuit 50 can compare the voltage to a 4.1V reference voltage when the voltages of the two power signals are 3.3V and 5V. As the received voltage crosses the threshold, switches 52 of the tune/detune circuit 42 are controlled to enable or disable a tuning circuit (not shown) by, for example, changing the bias across a PIN diode 54 to tune or detune the coil element 34. When the received voltage indicates the "tune" state, the tuning circuit is enabled. Otherwise, the tuning circuit is disabled. The power signals can be used to drive the comparator circuit 50.

Figure 5:
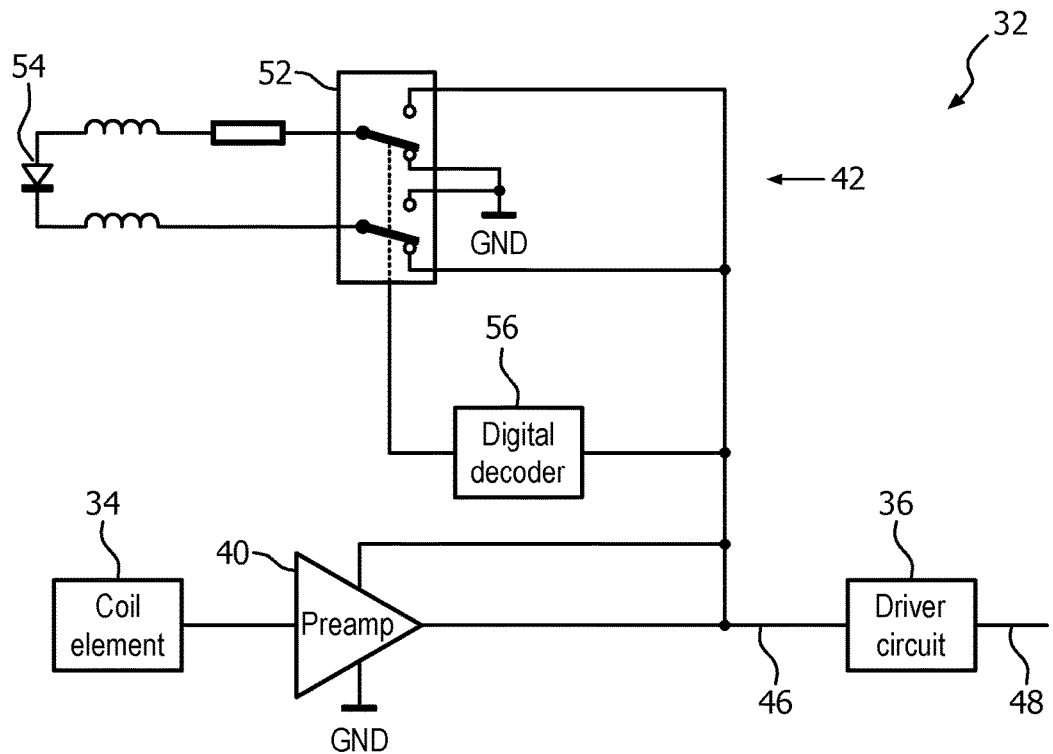
FIG. 5 illustrates a tune/detune circuit facilitating MR coil array connectivity.

While the foregoing discussion was applied to conveying a tune/detune control signal with power and RF output signals, it can be applied to convey a digital signal with power and RF output signals. In that regard, the "tune" and "detune" states can be used to convey a binary "1" and "0". The tune/detune circuit 42 then includes a digital decoder 56, such as a microcontroller, to decode digital data conveyed using the "tune" and "detune" states, as illustrated in FIG. 5. Based on the digital data, the digital decoder 56 enables or disables tuning (e.g., by changing the bias across the PIN diode 54). Other command can be digitally conveyed, such as commands for carrying out calibration of the receive coil arrays 26, 28. As with the preamplifier 40, the digital decoder 56 is powered using the power signals and must be capable of operating over the range of the voltages corresponding to the "tune" and "detune" states.

Further, while the foregoing discussion was specific to MR receive coil arrays, it is to be appreciated that the foregoing approach for combining signals finds application in MR transmit coil arrays and any other type of MR coil array. Further, the foregoing approach for combining signals finds application in other communication devices that combine different types of signals onto a single transmission line (e.g., antenna switches in cell phones).

Referring back to FIG. 1, a backend system 58 of the system 10 images the ROI using the scanner 14. The backend system 58 is typically remote from the scanner 14 and includes a plurality of modules 60, discussed hereafter, to perform the imaging of the ROI using the scanner 14.

A control module 62 of the backend system 58 controls overall operation of the backend system 58. The control module 62 suitably displays a graphical user interface (GUI) to a user of the backend system 58 using a display device 64 of the backend system 58. Further, the control module 62 suitably allows the operator to interact with the GUI using a user input device 66 of the backend system 58. For example, the user can interact with the GUI to instruct the backend system 58 to coordinate the imaging of the ROI.

A data acquisition module 68 of the backend system 58 performs MR scans of the ROI. For each MR scan, the data acquisition module 68 controls the transmitters 24 and/or the gradient controller 20 according to scan parameters, such as number of slices, to implement an imaging sequence within the imaging volume 16. An imaging sequence defines a sequence of $B_1$ pulses and/or magnetic field gradients that produce spatially encoded MR signals from the imaging volume 16. Further, the data acquisition module 68 controls the receivers 30, and the tune/detune control signal of the driver circuit 36, according to scan parameters to acquire spatially encoded MR signals to an MR data set. The MR data set is typically stored in at least one storage memory 70 of the backend system 58.

In preparing for MR acquisition, the ROI is positioned within the imaging volume 16. For example, the patient 12 is positioned on the patient support. The surface coil 28 is then positioned on the patient 12 and the patient support moves the ROI into the imaging volume 16.

A reconstruction module 72 of the backend system 58 reconstructs the MR data sets of the MR diagnostic scans into MR images or maps of the ROI. This includes, for each MR signal captured by the MR data sets, spatially decoding the spatial encoding by the magnetic field gradients to ascertain a property of the MR signal from each spatial region, such as a pixel or voxel. The intensity or magnitude of the MR signal is commonly ascertained, but other properties related to phase, relaxation time, magnetization transfer, and the like can also be ascertained. The MR images or maps are typically stored in the storage memory 70.

Each of the plurality of modules 60 can be embodied by processor executable instructions, circuitry (i.e., processor independent), or a combination of the two. The processor executable instructions are stored on at least one program memory 74 of the backend system 58 and executed by at least one processor 76 of the backend system 58. As illustrated, the plurality of modules 60 are embodied by processor executable instructions. However, as is to be appreciated, variations are contemplated. For example, the data acquisition module 68 can be circuitry.

Figure 6:
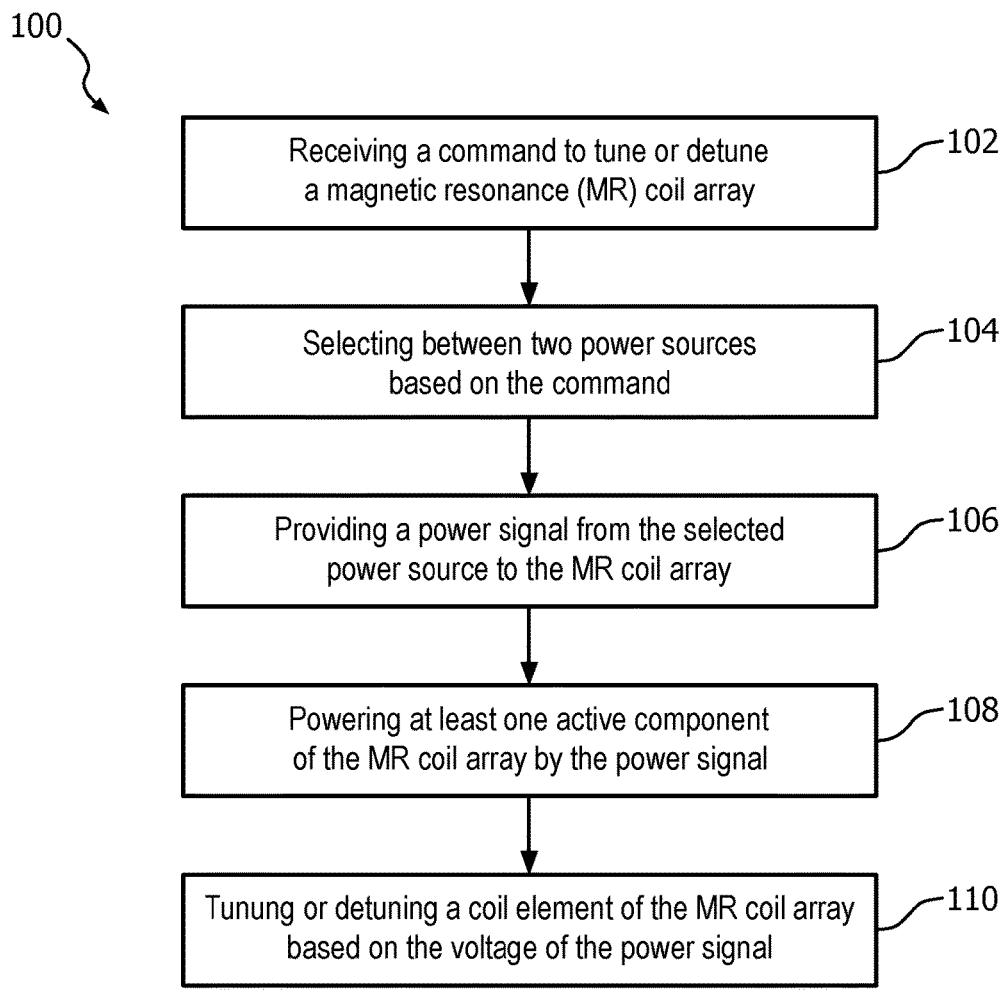
FIG. 6 illustrates a method for tuning or detuning an MR coil array with enhanced connectivity.

With reference to FIG. 6, a method 100 for tuning or detuning an MR coil array, such as the whole body coil 26 and/or the surface coil 28, is provided. The method 100 includes receiving 102 a command to tune or detune the MR coil array by the driver circuit 36. The command can be analog or digital, and is typically received from the backend system 58 or the receivers 30. The driver circuit 36 selects 104 between two power sources based on the command. Each power source provides a different direct current (DC) voltage of the same polarity as the other (e.g., 3.3V and 5V). A power signal from the selected power source is then provided 106 to the MR coil array over a coaxial transmission line 46, 48. The power signal powers 108 at least one active component 40 of the MR coil array. Thereafter, a coil element 34 of the MR coil array is tuned or detuned by the tune/detune circuit 42 of the MR coil array. The tune/detune circuit 42 tunes or detunes the coil element 34 based on the voltage of the power signal.

As used herein, a memory includes one or more of: a non-transient computer readable medium; a magnetic disk or other magnetic storage medium; an optical disk or other optical storage medium; a random access memory (RAM), read-only memory (ROM), or other electronic memory device or chip or set of operatively interconnected chips; an Internet/Intranet server from which the stored instructions may be retrieved via the Internet/Intranet or a local area network; and the like. Further, as used herein, a processor includes one or more of a microprocessor, a microcontroller, a graphic processing unit (GPU), an application-specific integrated circuit (ASIC), an FPGA, and the like; a controller includes: (1) a processor and a memory, the processor executing computer executable instructions on the memory embodying the functionality of the controller; or (2) analog and/or digital hardware; a user input device includes one or more of a mouse, a keyboard, a touch screen display, one or more buttons, one or more switches, one or more toggles, voice recognition engines, and the like; a database includes one or more memories; and a display device includes one or more of a LCD display, an LED display, a plasma display, a projection display, a touch screen display, and the like.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. A magnetic resonance (MR) coil channel comprising:
   a coil element configured to receive resonance signals;
   at least one active component powered by a power signal carried on a coaxial transmission line, the voltage of the power signal carried on the coaxial transmission line varying between first and second direct current (DC) voltages of the same polarity; and
   a tune/detune circuit connected to the coaxial transmission line and the coil element, the tune/detune circuit being configured to tune the coil element in response to the power signal reaching the first DC voltage, and detune the coil element in response to the power signal reaching the second DC voltage;
   wherein the tune/detune circuit includes a comparator circuit configured to compare the voltage of the power signal to a reference voltage to determine whether to tune or detune the coil element.

2. The MR coil channel according to claim 1, wherein the coil element detects radiofrequency (RF) signals, and wherein the detected RF signals are provided to an external system or device on the coaxial transmission line.

3. The MR coil channel according to claim 2, wherein the at least one active component includes a preamplifier configured to amplify the detected RF signals and provide the amplified RF signals to the external system or device over the coaxial transmission line.

4. The MR coil channel according to claim 3, wherein the preamplifier is gain stable over the first and second DC voltages.

5. A magnetic resonance (MR) coil array including one or more coil channels, each corresponding to a coil element, the MR coil array connected to an external system or device using a coaxial transmission line and comprising:
   a coil element corresponding to one of the coil channels; and
   a coil element circuit corresponding to the coil element, the coil element circuit including:
      at least one active component powered by a power signal carried on the coaxial transmission line, the voltage of the power signal varying between first and second direct current (DC) voltages of the same polarity, and
      a tune/detune circuit connected to the coaxial transmission line and the coil element, the tune/detune circuit tunes or detunes the coil element based on the first and second DC voltages of the power signal,
      wherein the voltage of the power signal is used to convey digital data facilitating calibration at production time of the MR coil array.

6. The MR coil channel according to claim 1, wherein the tune/detune circuit is configured to tune or detune the coil element by changing a bias across a PIN diode.

7. A method for tuning or detuning an MR coil array including one or more coil channels, each coil channel corresponding to a coil element, the MR coil array connected to an external system or device using a coaxial transmission line, the method comprising:
   powering at least one active component of the MR coil array by a power signal carried on the coaxial transmission line, the voltage of the power signal varying between first and second direct current (DC) voltages, the first and second DC voltages both having the same polarity;
   receiving by a driver circuit a command to tune or detune the MR coil array, the driver circuit being connected to the coaxial transmission line;
   selecting by the driver circuit between two power sources based on a command, each power source providing one of the same polarity first and second DC voltages;
   providing by the driver circuit the power signal from the selected power source to the MR coil array over the coaxial transmission line; and
   tuning or detuning a coil element of the MR coil array corresponding to one of the coil channels by a tune/detune circuit of the MR coil array, wherein the tune/detune circuit tunes the coil element in response to the first DC voltage of the power signal, detunes the coil element in response to the second DC voltage, and is connected to the coaxial transmission line.

8. The method according to claim 7, wherein the at least one active component includes a preamplifier, configured to amplify radio frequency (RF) signals received from the MR coil array and send the amplified RF signals over the coaxial transmission line.

9. The method according to claim 8, further including:
   reconstructing the amplified RF signals sent over the coaxial transmission into an MR image; and
   displaying the MR image on a display device.

10. The method according to claim 7, further including:
    tuning the coil element by the tune/detune circuit in response to the power signal reaching the first DC voltage; and
    detuning the coil element by the tune/detune circuit in response to the power signal reaching the second DC voltage.

11. The method according to claim 7, further including:
    changing a bias across a PIN diode of the MR coil array by the tune/detune circuit to tune or detune the coil element.

12. The method according to claim 7, wherein the first DC voltage corresponds to a tune state and the second DC voltage corresponds to a detune state.

13. A magnetic resonance (MR) system comprising:
    a coaxial transmission line configured to connect an external device or system to a coil channel, the external device or system including a driver circuit configured to output a first direct current (DC) voltage and a second DC voltage over the coaxial transmission line, the first and second DC voltages being of the same polarity;
    wherein the coil channel includes:
       a coil element configured to receive MR signals, a tune/detune circuit configured to tune the coil element in response to receiving the first DC voltage via the coaxial transmission line and detune the coil element in response to receiving the second DC voltage via the transmission line, a preamplifier configured to receive the MR signals from the coil element, amplify the received MR signals, and transmit the amplified MR signals over the coaxial transmission line to the external system or device, the preamplifier being powered by the first DC voltage when the first DC voltage is sent over the coaxial transmission line, and by the second DC voltage when the second DC voltage is sent over the coaxial transmission line, the preamplifier being gain stable when powered by the first or second voltage.

14. The MR system according to claim 13, further including:

a backend system configured to control the MR coil array, control the driver circuit and generate an MR image of a patient from the amplified MR signals.

15. The MR system according to claim 13, wherein the power signal is used to convey digital data over the coaxial transmission line.

\* \* \* \* \*